(12) United States Patent
Rho et al.

(10) Patent No.: US 12,456,653 B2
(45) Date of Patent: Oct. 28, 2025

(54) PACKAGING SUBSTRATE AND SEMICONDUCTOR DEVICE COMPRISING THE SAME

(71) Applicant: Absolics Inc., Covington, GA (US)

(72) Inventors: Youngho Rho, Suwon-si (KR); Jincheol Kim, Suwon-si (KR)

(73) Assignee: Absolics Inc., Covington, GA (US)

( * ) Notice: Subject to any disclaimer, the term of this patent is extended or adjusted under 35 U.S.C. 154(b) by 427 days.

(21) Appl. No.: 18/010,809

(22) PCT Filed: Apr. 28, 2022

(86) PCT No.: PCT/US2022/026847
§ 371 (c)(1),
(2) Date: Dec. 16, 2022

(87) PCT Pub. No.: WO2022/232467
PCT Pub. Date: Nov. 3, 2022

(65) Prior Publication Data
US 2023/0307304 A1    Sep. 28, 2023

(30) Foreign Application Priority Data

Apr. 30, 2021  (KR) .................. 10-2021-0056448

(51) Int. Cl.
*H01L 23/498*  (2006.01)
*H01L 23/13*  (2006.01)
(Continued)

(52) U.S. Cl.
CPC .............. *H01L 23/13* (2013.01); *H01L 23/15* (2013.01); *H01L 23/5383* (2013.01);
(Continued)

(58) Field of Classification Search
CPC ..... H01L 23/13; H01L 23/15; H01L 23/5383; H01L 23/5384; H01L 23/49827;
(Continued)

(56) References Cited

U.S. PATENT DOCUMENTS

2014/0032751 A1   1/2014  Branson
2016/0148873 A1*  5/2016  Chiang ................... H01L 24/00
                                                            257/774
(Continued)

FOREIGN PATENT DOCUMENTS

| | | |
|---|---|---|
| CN | 111312697 | 6/2020 |
| JP | 2014045026 | 3/2014 |

(Continued)

OTHER PUBLICATIONS

"International Preliminary Report on Patentability (Form PCT/IB/373) of PCT/US2022/026847," issued on Oct. 24, 2023, pp. 1.

(Continued)

*Primary Examiner* — Omar F Mojaddedi
(74) *Attorney, Agent, or Firm* — JCIP GLOBAL INC.

(57) ABSTRACT

Disclosed are a packaging substrate comprising a glass substrate comprising a first surface and a second surface which is the opposite surface of the first surface; a cavity unit forming a space inside the glass substrate; a cavity frame dividing the space into plural districts; and a cavity element comprised in at least some of the cavity unit, wherein the cavity frame comprises plural frame through holes penetrating in a direction from the one side to the other side.

8 Claims, 11 Drawing Sheets

(51) Int. Cl.
    *H01L 23/15* (2006.01)
    *H01L 23/538* (2006.01)
    *H01L 23/00* (2006.01)
    *H01L 25/10* (2006.01)

(52) U.S. Cl.
    CPC .......... *H01L 23/5384* (2013.01); *H01L 24/16* (2013.01); *H01L 24/17* (2013.01); *H01L 25/105* (2013.01); *H01L 2224/16145* (2013.01); *H01L 2224/16225* (2013.01); *H01L 2224/17181* (2013.01)

(58) Field of Classification Search
    CPC ... H01L 23/5389; H01L 23/481; H01L 24/16; H01L 24/17; H01L 25/105; H01L 25/0652; H05K 1/0206; H05K 1/0306; H05K 1/115; H05K 1/186; H05K 3/0094
    See application file for complete search history.

(56) References Cited

U.S. PATENT DOCUMENTS

| | | | |
|---|---|---|---|
| 2017/0229388 A1* | 8/2017 | Fukasawa | H01L 23/49827 |
| 2017/0284880 A1 | 10/2017 | Beer et al. | |
| 2018/0130761 A1* | 5/2018 | Kim | H01L 24/05 |
| 2020/0058567 A1* | 2/2020 | Kim | H01L 23/5384 |
| 2021/0043528 A1 | 2/2021 | Kim et al. | |

FOREIGN PATENT DOCUMENTS

| | | |
|---|---|---|
| JP | 2017050315 | 3/2017 |
| JP | 2021502706 | 1/2021 |
| KR | 1020150083278 | 7/2015 |
| KR | 1020160082286 | 7/2016 |
| KR | 101781989 | 9/2017 |
| KR | 1020200086319 | 7/2020 |
| TW | 201041024 | 11/2010 |
| WO | 2020185016 | 9/2020 |

OTHER PUBLICATIONS

"International Preliminary Report on Patentability (Form PCT/IB/326) of PCT/US2022/026847," mailed on Nov. 9, 2023, pp. 1.

"Written Opinion of the International Searching Authority (Form PCT/ISA/237) of PCT/US2022/026847," mailed on Aug. 12, 2022, pp. 1-4.

\* cited by examiner (a)

(b)

(a)

(b)

PACKAGING SUBSTRATE AND SEMICONDUCTOR DEVICE COMPRISING THE SAME

CROSS-REFERENCE TO RELATED APPLICATION

This application is a 371 of international application of PCT application serial no. PCT/US2022/026847, filed on Apr. 28, 2022, which claims the priority benefit of Korea application no. 10-2021-0056448, filed on Apr. 30, 2021. The entirety of each of the above mentioned patent applications is hereby incorporated by reference herein and made a part of this specification.

FIELD

The present application relates to a packaging substrate having a cavity frame with a through hole for dividing into plural spaces and a semiconductor device including the same.

RELATED ART

In the manufacturing of electronic components, the implementation of a circuit on a semiconductor wafer is referred to as a Front-End Process (FE), and the assembly of a wafer such that it can be actually used in a product is referred to as a Back-End Process (BE). Back-End process includes a packaging process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit. 10 million or more cells, high-speed operation, and much heat dissipation, but is not supported by packaging technology completely. Thus, it is considered that the electrical performance of packaged semiconductors may be determined by the packaging technology with electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of conductive lines.

Recently, researches are being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

However, during manufacturing processes for miniaturization of such a glass substrate, a possibility of generating a bending problem, damage, or defects in the original plate may be higher, and a solution for improving such a problem and heat emitting efficiency is being required.

The above-described background technology is technical information acquired by the inventor for derivation of an embodiment or acquired during the derivation process and is not necessarily a prior art disclosed to the general public before filing the present disclosure.

As a related prior art, there is "Multi-layered Substrate and Manufacturing Method for Multi-layered Substrate" as disclosed in Korean Patent Publication No. 10-2015-0083278.

DISCLOSURE

Technical Problem

The present application has been devised to solve the aforementioned problems, and the present application discloses a packaging substrate including a cavity structure improved in heat emitting functionality and having enhanced mechanical and electrical properties.

Technical Solution

In a general aspect, a packaging substrate according to embodiments includes,
    a glass substrate including a first surface and a second surface which is the opposite surface of the first surface;
    a cavity unit having a space formed inside the glass substrate;
    a cavity frame dividing the space into plural districts; and
    a cavity element included in at least some of the cavity unit,
    wherein the cavity frame may include a frame through hole penetrating in a direction from the one surface to the other surface.

In one embodiment, the frame through hole may have a diameter of 30 μm to 500μ m.

In one embodiment, the diameter of the frame through hall R and the length of the frame through hole Lh may have a ratio R/Lh of 1 to 10.

In one embodiment, the frame through hole may be included in a plural number, and an interval between the plural frame through holes may be 1 time or more of the diameter of the frame through hole.

In one embodiment, the cavity frame may have a width of 1.5 times or more compared to the diameter of the frame through hole.

In one embodiment, the frame through hole may have at least some or the whole filled with a first material, and
    the first material may be any one selected from the group consisting of copper, epoxy, silica, and compositions thereof.

In one embodiment, the glass substrate may include a first area having a first thickness and a second area having a second thickness which is a thinner thickness than the first thickness,
    wherein the cavity unit may be located on or under the second area.

In one embodiment, a supporting unit may be disposed in a side of the cavity frame.

In one embodiment, the glass substrate may include a core via penetrating in a direction from the first surface to the second surface except the cavity frame, and
    a core distribution layer may be included on the first and second surfaces connected to the core via.

In one general aspect, a semiconductor device according to embodiments includes,
    a semiconductor element unit in which one or more semiconductor element is disposed;

a packaging substrate electrically connected to the semiconductor element; and a mainboard electrically connected to the packaging substrate and transmitting electrical signals of the semiconductor element and the external to be connected from each other, wherein the packaging substrate may be a packaging substrate according to the above.

Advantageous Effects

A packaging substrate according to embodiments includes a cavity frame which is dividing an internal space and comprises a frame through hole at the cavity frame, and thereby can make heat emitting of an internal element be easier and improve mechanical and electrical properties.

Figure 1:
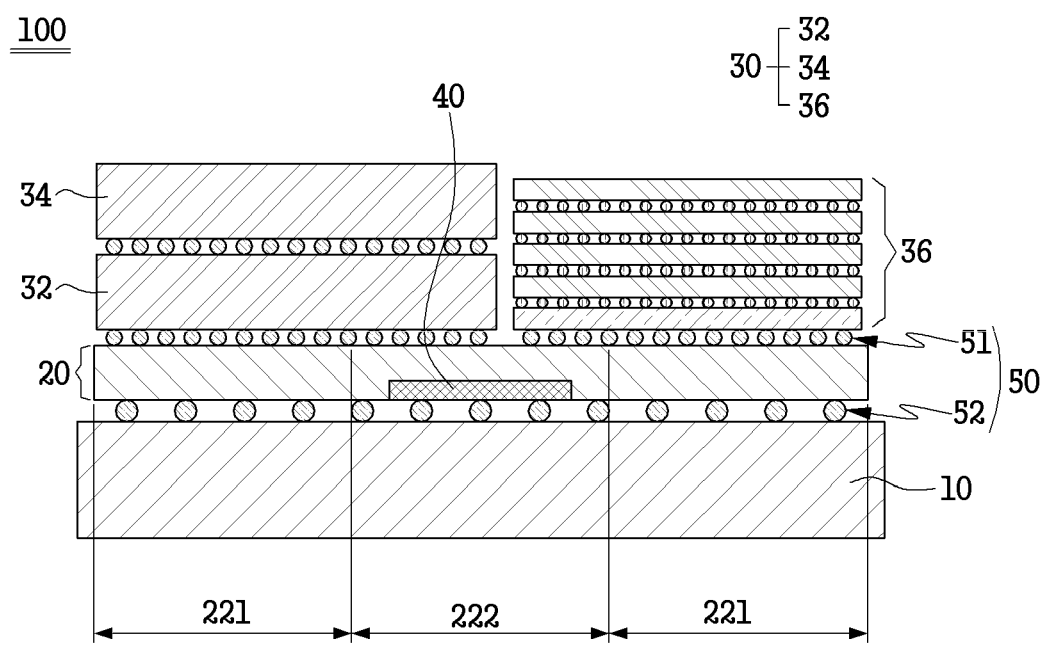
FIG. 1 is a conceptual view for illustrating a sectional structure of a semiconductor device according to embodiments.
Figure 2:
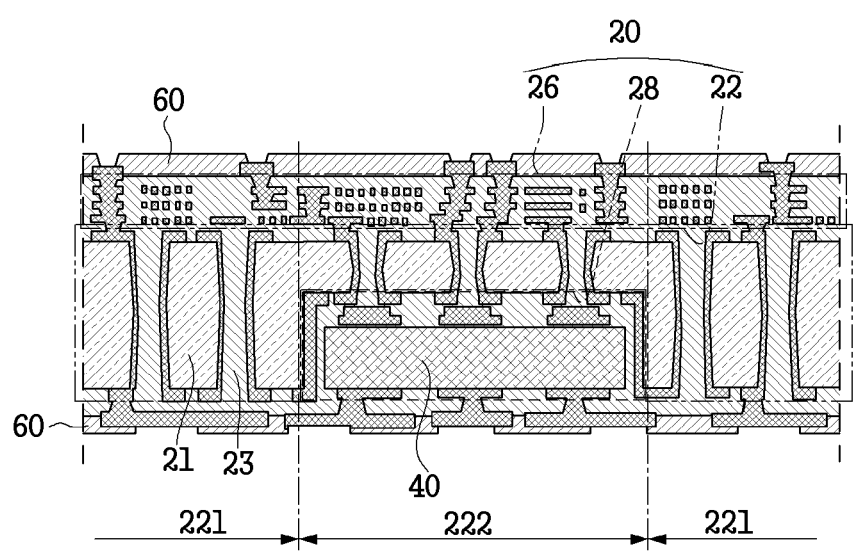
FIG. 2 is a conceptual view for illustrating a sectional structure of the internal of a packaging substrate according to another embodiment where a cavity element is disposed.
Figure 3:
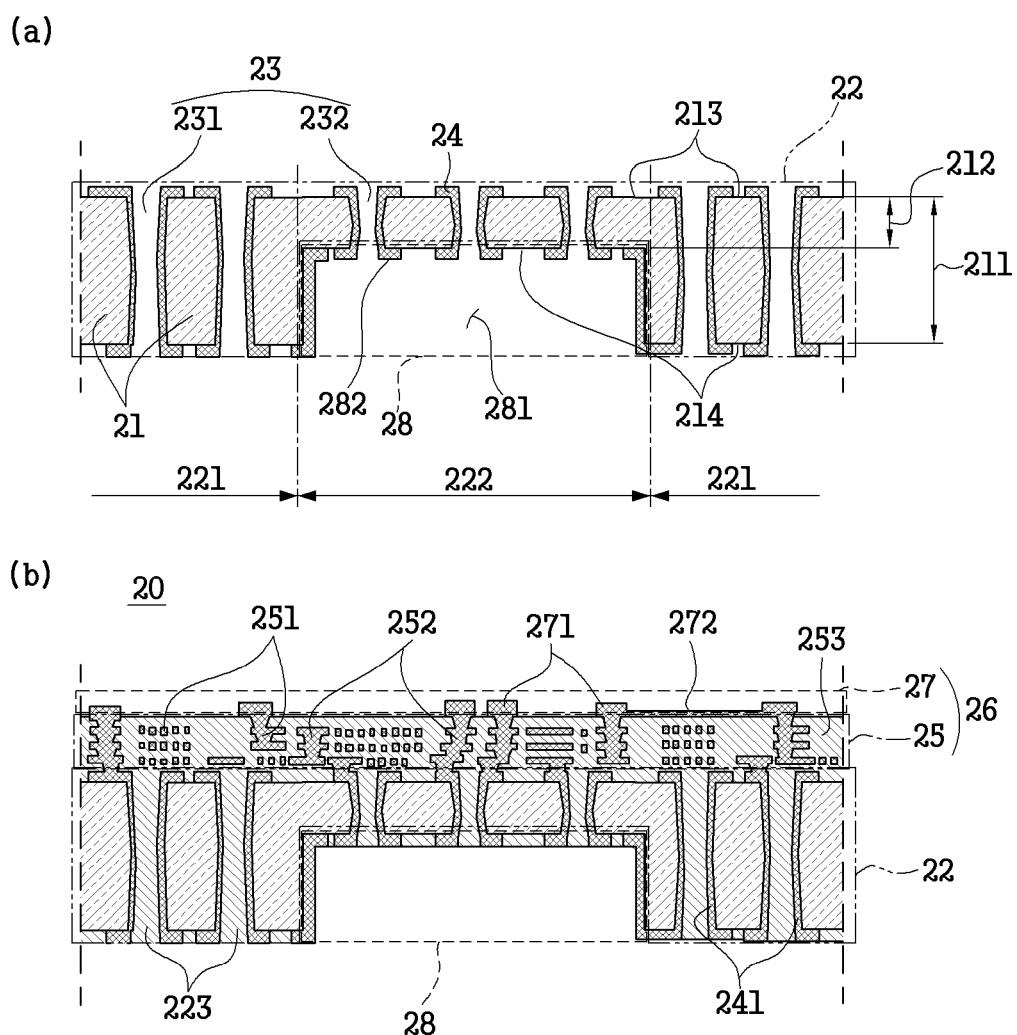
Figure 4:
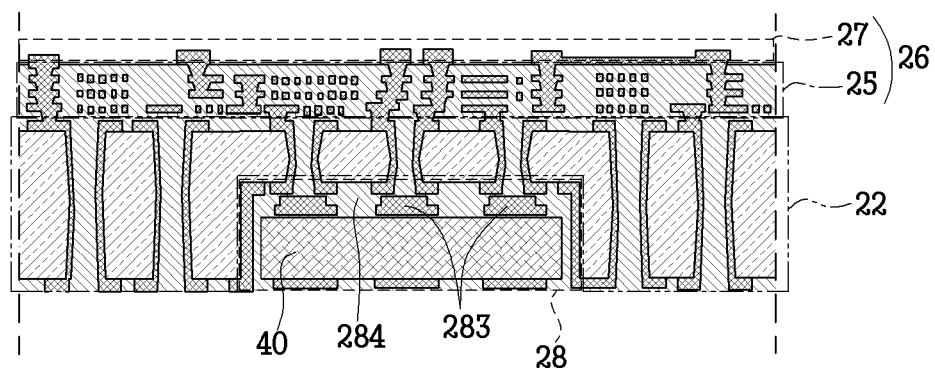
Figure 4:
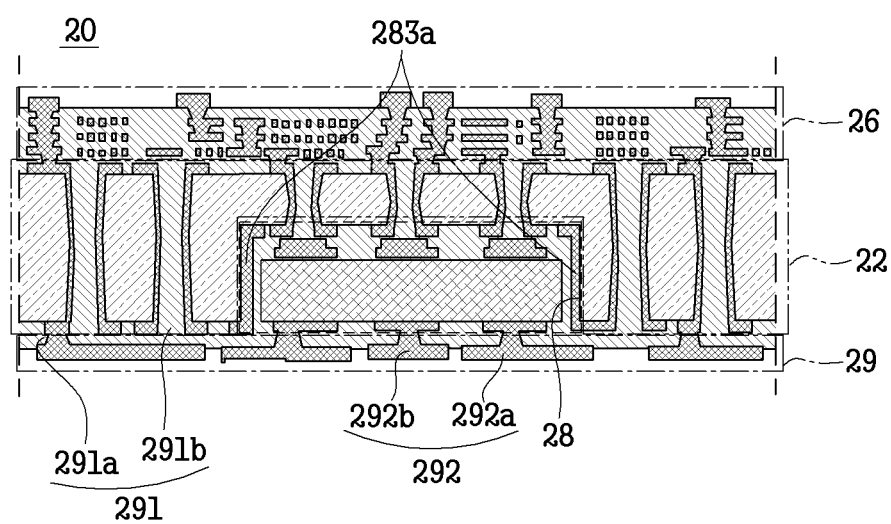
Figure 5:
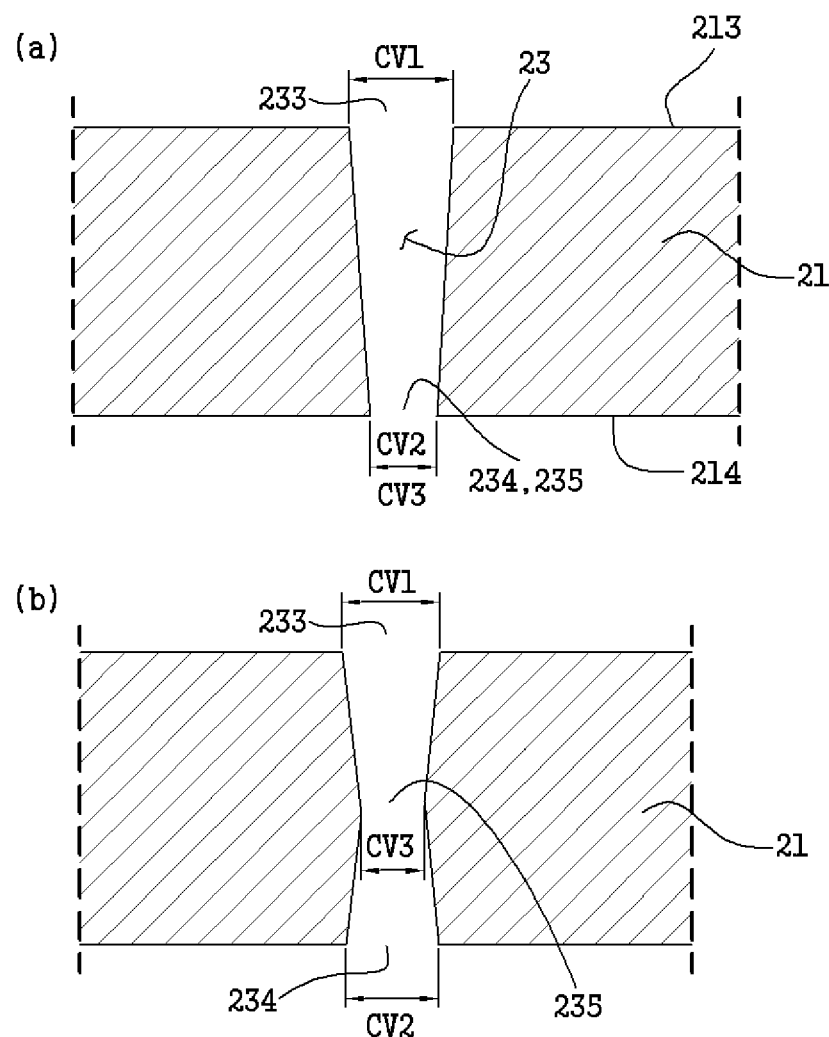
Figure 6:
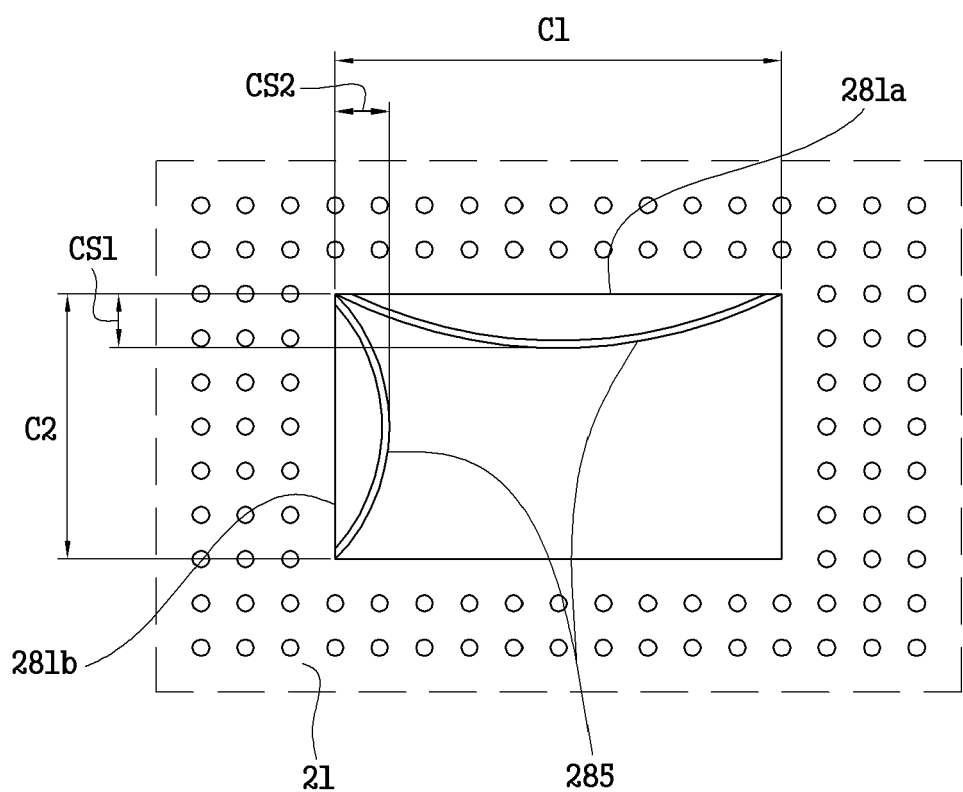
Figure 7:
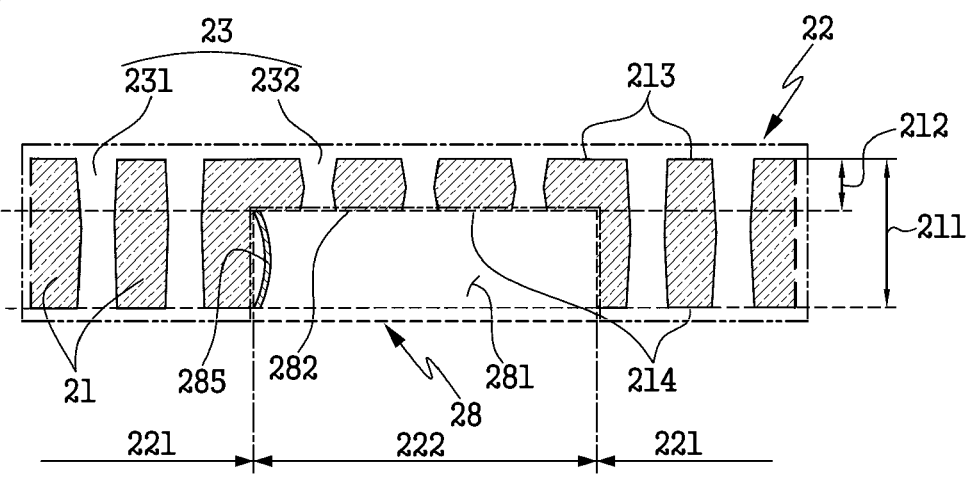
Figure 7:
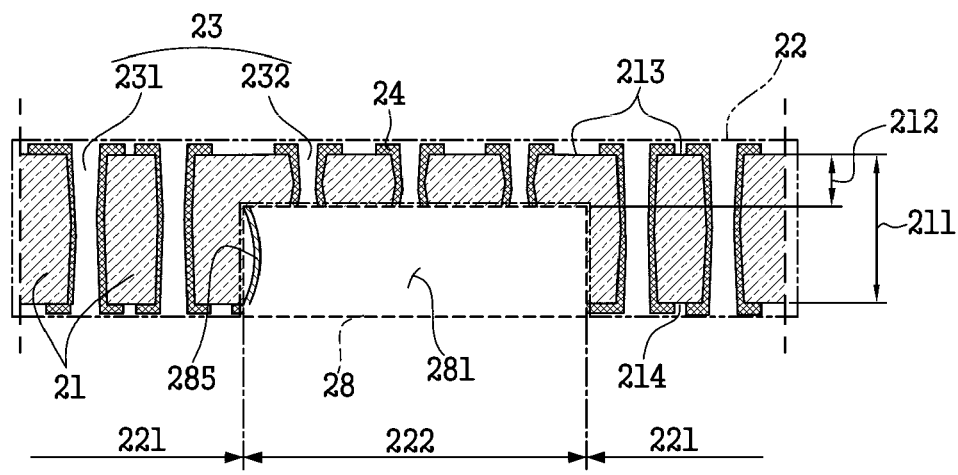
Figure 8:
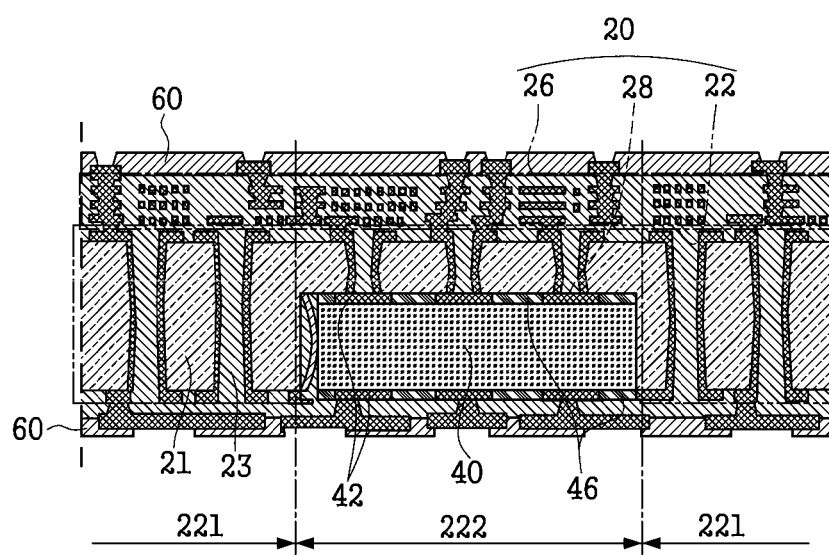
Figure 9:
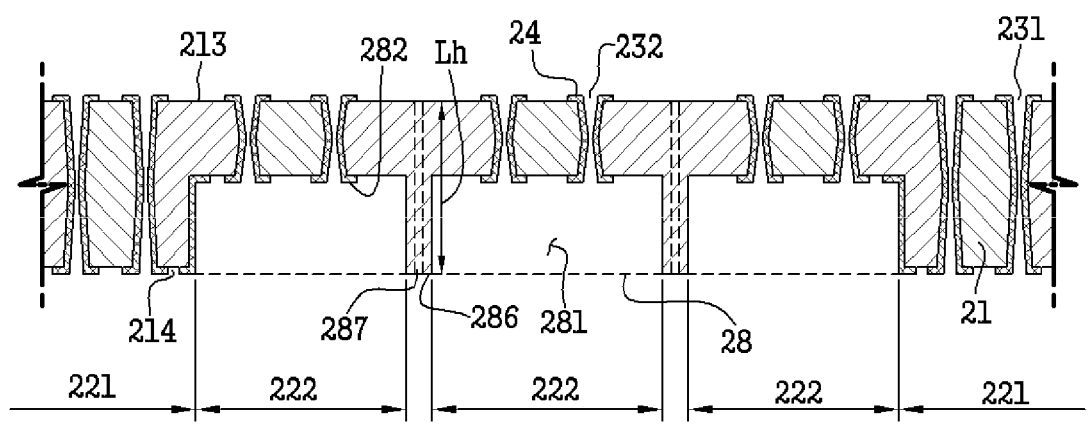
Figure 10:
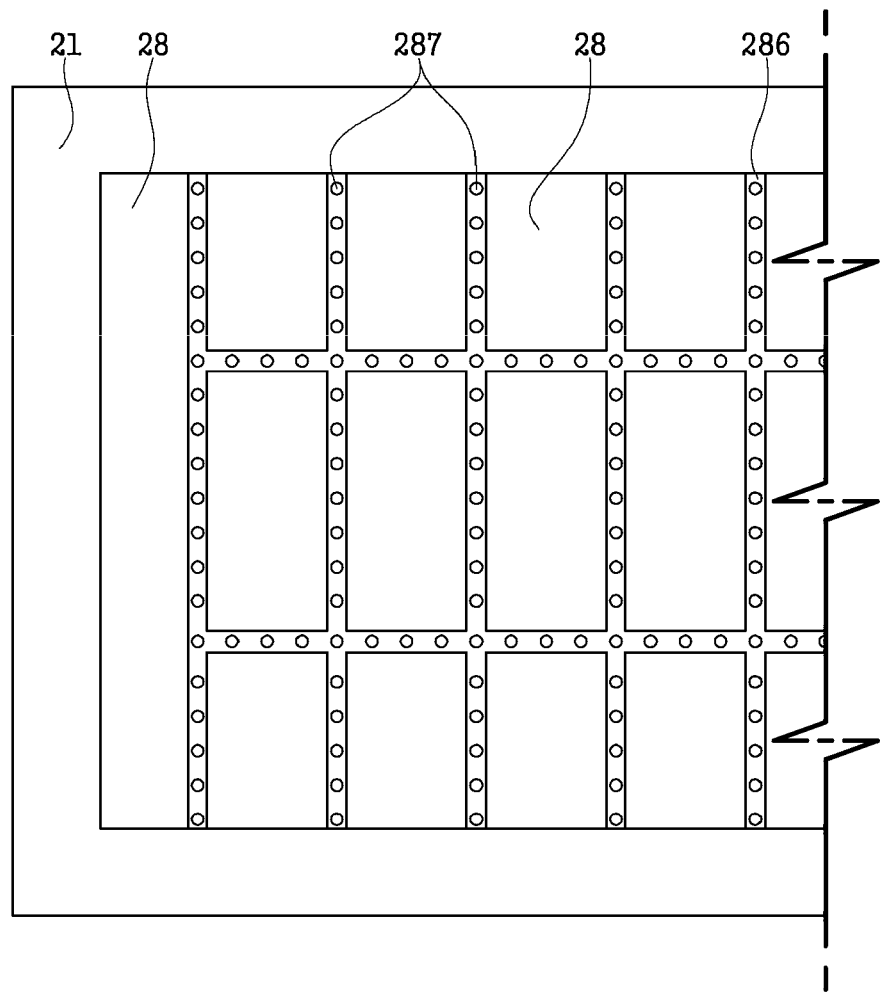
Figure 11:
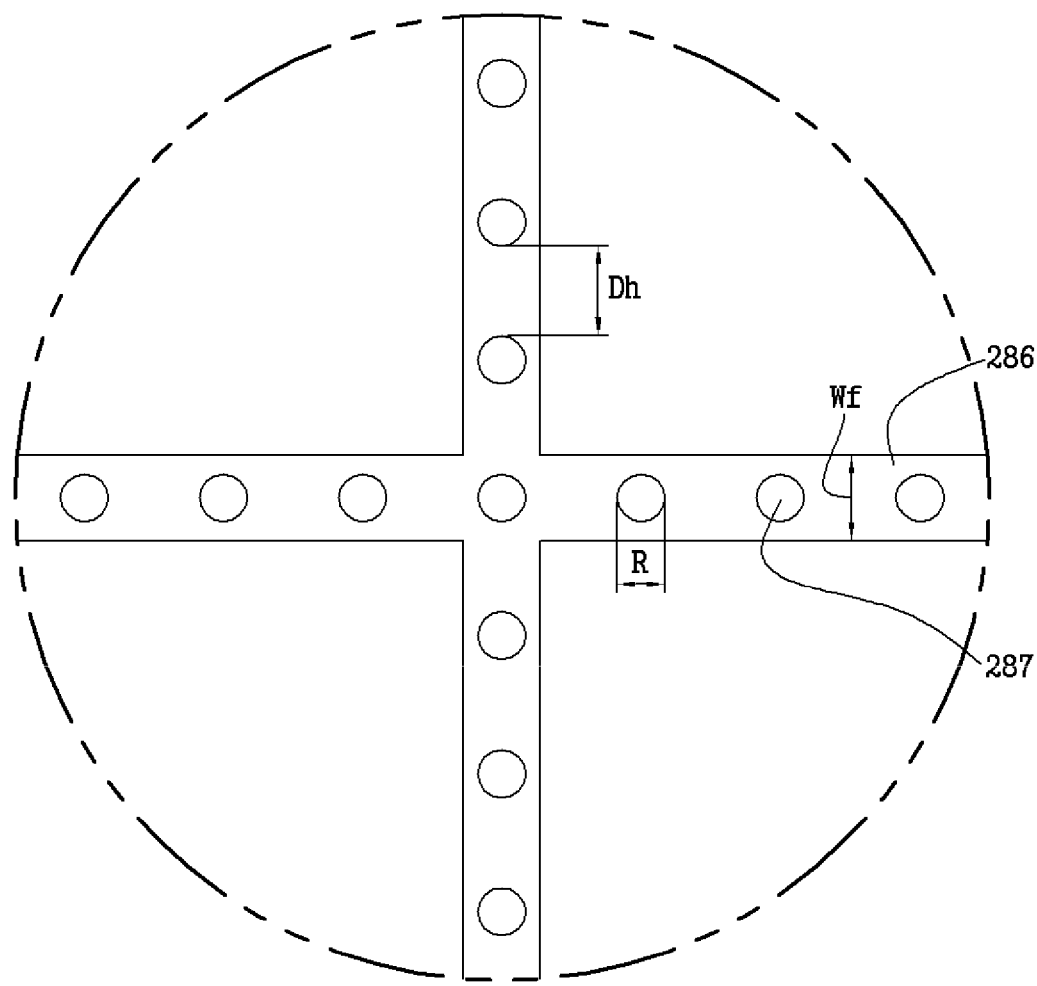

(*a*) and (*b*) of FIG. 3 are conceptual views for illustrating some of a packaging substrate and their internal space according to embodiments by using sections, respectively;

(a) and (b) of FIG. 4 are conceptual views for illustrating some of a packaging substrate and their internal space having a cavity element disposed therein according to embodiments by using sections, respectively;

FIG. 5 is a conceptual view for illustrating a form of a core via formed in a glass substrate according to embodiments by using a section;

FIG. 6 is a conceptual view for illustrating a glass substrate having a cavity unit in which a supporting unit is applied according to embodiments as viewed in an upper position;

FIG. 7 is a conceptual view for illustrating a glass substrate having cavity unit in which a supporting unit is applied according to embodiments by using a section;

FIG. 8 is a conceptual view for illustrating an image of a cavity element being fixed to a glass substrate having a cavity unit and in which a supporting unit is applied according to embodiments;

FIG. 9 is a conceptual view for illustrating a sectional structure of the internal of a packaging substrate in which a cavity frame and a frame through hole are disposed according to embodiments;

FIG. 10 is a conceptual view for illustrating a glass substrate having a cavity frame and a frame through hole according to embodiments as viewed in an upper position; and FIG. 11 is a conceptual view for illustrating a glass substrate having a cavity frame and a frame through hole according to embodiments as a more detailed image viewed in an upper position.

DETAILED DESCRIPTION OF EXEMPLARY EMBODIMENTS

Hereinafter, example embodiments of the present disclosure will be described in detail with reference to the accompanying drawings so that they can be easily practiced by those skilled in the art to which the present invention pertains. The example embodiments may, however, be embodied in many different forms and is not to be construed as being limited to the embodiments set forth herein. Like reference numerals designate like elements throughout the specification.

Throughout this application, the phrase that a certain element "comprises" or "includes" another element means that the certain element may further include one or more other elements but does not preclude the presence or addition of one or more other elements, unless stated to the contrary.

Throughout this application, it will be understood that when an element is referred to as being "connected" to another element, it can be directly connected to the other element or intervening elements may be present.

In this application. "B being placed on A" means that B is placed in direct contact with A or placed over A with another layer or structure interposed therebetween and thus should not be interpreted as being limited to B being placed in direct contact with A, unless the description clearly dictates.

In this application, the phrase "combination(s) thereof" included in a Markush-type expression denotes one or more mixtures or combinations selected from the group consisting of components stated in the Markush-type expression, that is, denotes that one or more components selected from the group consisting of the components are included.

In this application, the description "A and/or B" means "A or B. or A and B."

In this application, terms such as "first," "second." "A," or "B" are used to distinguish the same terms from each other. The singular forms "a." "an." and "the" include the plural form unless the context clearly dictates otherwise.

In this application, a singular form is contextually interpreted as including a plural form as well as a singular form unless specially stated otherwise.

The inventors have recognized that, in the process of developing a semiconductor device capable of exhibiting high performance with a more integrated and thinner thickness, not only the device itself but also the packaging process is an important factor for improving its performance. While conducting research on this, the inventors applied a glass core as a single layer, and applied a cavity frame and a through hole disposed at the cavity frame to demarcate plural cavity districts unlike a conventional interposer and organic substrate in which two or more layers of cores are applied on a mainboard as a packaging substrate. In this time, they have verified that the packaging substrate could be designed to be thinner and help to improve electrical properties of a semiconductor device, and thus have disclosed these embodiments.

Hereinafter, referring to drawings, example embodiments will be described in further detail.

Packaging Substrate 20

In one general aspect, a packaging substrate 20 according to embodiments comprises, a glass substrate 21 comprising one side 214 and the other side 213 which is the opposite surface of the one side;

a cavity unit 28 having a space 281 formed inside the glass substrate;

a cavity frame 286 dividing the space into plural districts; and a cavity element 40 comprised in at least some of the cavity unit, wherein the cavity frame may comprise a frame through hole 287 penetrating in a direction from the one side to the other side.

The packaging substrate 20 may comprise a core layer 22; an upper layer 26 disposed on one side of the core layer; and a cavity unit 28 in which the cavity element 40 can be disposed.

The packaging substrate 20 optionally may further comprise a lower layer 29 disposed under the core layer.

The core layer 22 may comprise a glass substrate 21, wherein the glass substrate may comprise a first area 221 having a first thickness 211 and a second area neighboring to the first area and having a second thickness 212 which is a thinner thickness than the first thickness.

The glass substrate 21 may comprise plural core vias 23 penetrating in a thickness direction. The glass substrate may comprise a core distribution layer 24 disposed on the surface of the glass substrate or core vias and electrically connecting the first surface 213 and the second surface 241 facing to the first surface.

The second area 222 of the core layer 22 may function as a cavity structure comprising an internal space 281.

Within the same area, the glass substrate 21 may comprise a first surface 213 and a second surface 214 facing each other, and these two surfaces may be substantially parallel to have a regular thickness in a glass substrate overall.

The glass substrate 21 may have a first thickness 211 as a thickness of the first area 221 which is thinner than a second thickness 212 as a thickness of the second area 222. In a portion where the first area and the second area meet, a side wall, which is a surface substantially perpendicular to the thickness direction of the first area, may be exposed in the glass substrate excepting for a portion which a core via 23. An internal space 281 formed by a thickness difference of the first and second areas can accommodate some or the whole of cavity elements.

A supporting unit 285 protruding from the side wall of the first area 221 to the internal space of the cavity may be comprised. At least some of the supporting unit may be connected to the side wall of the first area, another portion of the supporting unit may protrude to the internal space 281, to fix the position of an inserted cavity element 40. The glass substrate 21 having a form in which first and second areas different in the thickness are located to be adjacent in this manner, may be manufactured by laminating or combining glass substrates that are different in the thickness from each other.

All the core vias 23 of the glass substrate 21 may be formed as a first core via 231 in the first area 221, a second core via 232 in a second area 222, and the like, and may be formed with desired pitch and pattern.

As a packaging substrate of a semiconductor device, conventionally a silicon carbide substrate and an organic substrate were applied in a form of being laminated. A silicon substrate had disadvantages that were a possibility of generating a parasitic element when a high-speed circuit was applied and relatively large power loss, due to semiconductor properties of the silicon substrate. Also, an organic substrate requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to miniaturization of patterns due to properties of a material such as a polymer applied to an organic substrate. Embodiments applies a glass substrate 21 as a supporting body of a core layer 22 as a method for addressing the above problems. Additionally, a core via 23 formed to penetrate a glass substrate, a cavity frame 286 dividing an internal space 281 of the glass substrate, a frame through hole 287 formed to penetrate the cavity frame, and the like may be applied with the glass substrate, and thereby it is possible to provide a packaging substate 20 having advantages that are increase of heat emitting efficiency and increase of absorbing electromagnetism.

A cavity frame dividing an internal space 281 of the glass substrate 21 may be thicker than a second thickness of the second area or may be substantially same as a first thickness of the first area 221.

Divided spaces from the internal space 281 divided by the cavity frame 286 may have respectively different areas or may have substantially same area based on a vertical or horizontal line.

The cavity frame 286 may have a regular section and may be extended in a thickness direction facing to a second surface 214 from a first surface 213. And the cavity frame 286 may comprise a frame through hole 287 penetrating in the thickness direction.

The cavity frame 286 may form a divided space to make the internal space 281 be divided into plural rectangular districts as viewing the first surface in an upper or lower position, and may have a predetermined width Wf. Additionally, the cavity frame may comprise a vertical frame and a horizontal frame, and the vertical and horizontal frames may be the same or different in the thickness (or height).

The cavity frame 286 may have a width of 1.5 times or more, or 2 times or more compared to a diameter of the frame through hole 287. The cavity frame may have a width of 5 times or less, or 4 times or less compared to a diameter of the frame through hole. In this time, the diameter may be based on the maximum diameter of the frame through hole. A cavity frame having such a width may satisfy proper strength and durability while dividing the internal space 281 stably.

The cavity frame 286 may be made of substantially same material as the glass substrate.

The frame through hole 287 may have a diameter (R) of 30 μm to 500 μm. 50 μm to 450 μm, or 100 μm to 400 μm. Also, when the diameter of the frame through hole is R and the length in the penetrating direction of the frame through hole is Lh, a ratio R/Lh may be 1 to 10, or 2 to 8. When having the characteristics of such diameter and length of a frame through hole, it is possible to provide a packaging substrate improved in the mechanical, thermal, and electrical properties.

The frame through hole 287 may have at least some or the whole filled with a first material. And the first material may be a metal, an organic material, a ceramic, or the like, and for example, may be any one selected from the group consisting of copper, epoxy, silica, and compositions thereof. By filling the frame through hole with such a material, it is possible to make heat emitting be easier to improve mechanical properties.

The frame through hole 287 may also comprise a plating layer or a coating layer, the material of the coating material may be the first material, and the plating layer may be connected to a core distribution layer 24.

The frame through hole 287 may be comprised in a plural number, may be arranged orderly according to predetermined intervals in a direction perpendicular to a width direction of the cavity frame 286. Or the frame through hole 287 may have irregular intervals. When intervals between the frame through holes are regular, an interval Dh between one frame through hole and an adjacent frame through hole may be 1 time or more. 1 time to 10 times, or 2 times to 5 times compared to a diameter of the frame through hole.

When having such an interval, it is possible to provide a packaging substrate improved in the mechanical, thermal, and electrical properties.

The frame through hole 287 may have a shape of a section perpendicular to the penetrating direction, which is circle, oval, polygon, or the like, and for example the shape may be a circle.

The shape of a section perpendicular to the penetrating direction may be the same in all regions in the penetrating direction of the frame through hole 287, and the frame through hole may have the minimum area in the center and the area may increase as heading to the external.

The glass substrate 21 may be for example, a borosilicate glass substrate, non-alkali glass substrate, or the like, but is not limited thereto.

The glass substrate 21 may have a first thickness 211 of 1.500 µm or less, 300 µm to 1.200 µm, 350 µm to 900 µm, or 350 µm to 700 µm which is a thickness measured in the first area 221. Although applying a thinner packaging substrate is advantageous in that electrical signal transmission can be made more efficient, but the packaging substrate also should function as a supporting body of packaging, so it is preferable to apply a glass substrate 21 having the above thickness.

The second thickness 212 which is a thickness of the second area 222 of the glass substrate 21 may be 80% or less, 20% to 80%, or 30% to 70% of the first thickness. In detail, the second thickness may be 1,000 µm or less, 700 µm or less, or 500 µm or less. Also, the second thickness may be 100 µm to 500 µm, or 100 µm to 350 µm. Also, the first area 221 and the second area may have a thickness difference larger than the thickness of a cavity element 40. When applying a glass substrate of a second area in such a thickness, it is possible to form a cavity structure more efficiently and stably.

The thickness of the glass substrate 21 refers to a thickness of a glass substrate itself excepting for a thickness of an electrically conductive layer disposed on the glass substrate or the like.

The internal space 281 may have a height of 50 µm to 500 µm, 150 µm to 450 µm, or 250 µm to 400 µm.

The core via 23 may be formed by removing a predetermined region of the glass substrate 21. In detail, the core via 23 may be formed by etching a glass plate physically and/or chemically.

The core via 23 may comprise a first opening part 233 in contact with the first surface; a second opening part 234 in contact with the second surface; and a minimum inner diameter part 235 having the smallest inner diameter in the entire core via from the first opening part 233 to the second opening part 234.

A first opening part diameter CV1 as a diameter of the first opening part and a second opening part diameter CV2 as a diameter of the second opening part may be substantially different or substantially the same. In the former case of substantially different diameters, the shape of the core via 23 viewed in the section may be substantially a quadrangle shape, and the core via may be a cylinder shape overall, or a barrel shape overall in which the inner diameter of the core via becomes slightly narrower in the center portion based on the thickness of a glass substrate. In the latter case of substantially same diameters, any one between two opening parts, 233 and 234 may have a smaller diameter than the other one, and the core via may be substantially a truncated cone shape having a section in a trapezoid shape.

The first opening part diameter CV1 and the second opening part diameter CV2 may be respectively 150 µm or less. 40 µm to 200 µm, or 70 µm to 120 µm.

When the core via 23 has a narrowing area in at least a part of the via, a size of a narrowed minimum inner diameter part CV3 may be 50% to 99%, or 70% to 95% based on larger one between a first opening part diameter CV1 and a second opening part diameter CV2. When having a size of an inner diameter narrowed in such a range, the formation of an electrically conductive layer and the like can proceed more harmoniously.

The average diameter of the minimum inner diameter part CV3 may be in detail, 50µm to 95 µm. 55 µm to 85 µm, or 60µm to 70µm.

A target opening part which is larger one between the first opening part diameter CV1 and the second opening part diameter CV2 may have an average diameter of 70 µm to 120 µm, or 80 µm to 105 µm.

The minimum inner diameter part CV3 may be located in a position of 40% to 60%, or 45% to 55% based on the first opening part when a total length of the core via 23 is designated as 100%. When the minimum inner diameter is in the position described above based on a total length of a core via in this manner, processes of designing an electrically conductive layer of a packaging substrate and forming the electrically conductive layer can be easier.

A thickness of an electrically conductive layer measured in larger one between the first opening part diameter CV1 and the second opening part diameter CV2 may be the same or thicker than a thickness of an electrically conductive layer formed on a portion CV3 having the minimum inner diameter within a core via.

The core via 23 may be disposed in a number of 100 to 3000, 100 to 2500, or 225 to 1024 based on a unit area (1 cm×1 cm) of the glass substrate 21. When satisfying such a pitch condition, it is possible to improve the formation of an electrically conductive layer and the like and performance of a packaging substrate.

The core via 23 may be disposed with a pitch of 1.2 mm or less, 0.12 mm to 1.2 mm, or 0.3 mm to 0.9 mm in the glass substrate 21. Such a case is advantageous for forming an electrically conductive layer and the like while maintaining mechanical properties of a glass substrate above a certain level.

The core distribution layer 24 may comprise a core distribution pattern 241 which is electrically conductive layers electrically connecting first and second surfaces of the glass substrate 21 through core vias and a core insulating layer 223 covering the core distribution pattern.

The core layer 22 may have an electrically conductive layer formed in the internal through a core via 23 and function as an electrical passage passing through a glass substrate 21, thereby connecting upper and lower portions of the glass substrate in a relatively short distance to have characteristics of faster transmission of electrical signals and low loss.

The core distribution patten 241 is a pattern electrically connecting a first surface 213 and a second surface 214 of the glass substrate through a core via 23, and in detail, may comprise a first surface distribution pattern 241a which is electrically conductive layers disposed on at least a part of the first surface 213 and a second surface distribution pattern 241c disposed on at least a part of the second surface 214, and a core via distribution pattern 241b electrically connecting the first surface distribution pattern and the second surface distribution pattern from each other through the core via 23. For example, a copper plating layer may be applied to the electrically conductive layers, but the electrically conductive layers are not necessarily limited thereto.

The glass substrate 21 functions as an intermediate role or an intermediary role for connecting a semiconductor element 30 and a mainboard 10 to the upper and lower parts thereof, respectively, and the core via 23 functions as a passage for transmitting electrical signals thereof, thereby facilitating signal transmission.

An upper layer 26 may be disposed on the first surface 213. The upper layer may comprise an upper distribution layer 25 and an upper surface connection layer 27 disposed on the upper distribution layer, and the uppermost surface of the upper layer 26 may be protected by a cover layer 60 having an opening part capable of being in direct contact with a connective electrode of the semiconductor element unit.

The upper distribution layer 25 may comprise an upper insulating layer 253 disposed on the first surface; and an upper distribution pattern 251 which has a predetermined pattern and built in the upper insulting layer as electrically conductive layers having at least some electrically connected to the core distribution layer 24.

Any material may be applicable to the upper insulating layer 253 as long as the material can be applied to a semiconductor element or an insulating layer of a packaging substrate, and for example, an epoxy-based resin containing a filler or the like may be applicable, but the present application is not necessarily limited thereto.

The insulating layer may be prepared by hardening after forming a coating layer. Or the insulating layer may be formed by hardening after laminating an un-hardened or semi-hardened insulating film on the core layer. In this case, when depressurizing lamination method or the like is applied, the insulator is embedded into a space even inside the core via, thereby enabling efficient process progression. Also, even though plural insulating layers are stacked, it may be difficult to substantially distinguish between the insulating layers, and therefore, collective one of plural insulating layers may be referred to as an upper insulating layer. Also, the core insulating layer 223 and the upper insulating layer 253 may be made of substantially same insulating material. In this case, the boundary therebetween may not be substantially distinguished.

The upper distribution pattern 251 refers to electrically conductive layers disposed in the upper insulating layer 253 in a predetermined form, and for example, may be formed through a build-up layer procedure. In detail, the upper distribution pattern 251 in which electrically conductive layers are vertically or horizontally formed in a desired pattern may be formed by repeating a process of: forming an insulating layer; removing an unnecessary part of the insulating layer and then forming an electrically conductive layer through copper plating or the like; removing optionally an unnecessary part of the electrically conductive layer and then forming an insulating layer on this electrically conductive layer; and removing an unnecessary part and then forming an electrically conductive layer through plating or the like.

Since the upper distribution pattern 251 is disposed between the core layer 22 and the semiconductor element unit 30, the upper distribution pattern may be formed to at least partially have a fine pattern so that the transmission of electrical signals to the semiconductor element unit 30 may proceed smoothly and a desired complicated pattern may be sufficiently accommodated. In this case, the fine pattern may have respective width and interval of less than 4 μm. 3.5 μm or less, 3 μm or less. 2.5 μm or less, or 1 μm to 2.3 μm (hereinafter, the description of the fine pattern is the same).

In order to form the upper distribution pattern 251 to comprise a fine pattern, at least two methods are applied in the example embodiments. One method is to apply a glass substrate 21 as a packaging substrate. The glass substrate 21 can have a considerably flat surface characteristic with a surface roughness Ra of 10 angstroms or less, thereby minimizing the influence of surface morphology of a supporting substrate on formation of the fine pattern. The other method is based on the properties of the insulating layer. As the insulating layer, generally a filler component may be applicable in addition to resin, and inorganic particles such as silica particles may be applicable as the filler. When the inorganic particles are applied to the insulating layer as the filler, the size of the inorganic particles can affect whether to form the fine pattern. Therefore, particle fillers with an average diameter of 150 nm or less are applied as the insulating layer in the present application. Specifically, particle fillers with an average diameter of 1 nm to 100 nm are comprised in insulating layer. Such a characteristic can minimize the influence of the insulating layer itself on the formation of an electrically conductive layer with a width of several micrometers or below while maintaining necessary properties of the insulating layer at a certain level or more, and can also help form a fine pattern with good adhesion onto the surface, due to the fine surface morphology.

The upper surface connection layer 27 comprises an upper surface connection pattern 272, which is at least partially electrical connected to the upper distribution pattern 251, and an upper surface connective electrode 271, which electrically connects the semiconductor unit 30 and the upper surface connection pattern 272. The upper surface connection pattern 272 may be disposed on one surface of the upper insulating layer 253 or may be embedded with at least a part thereof being exposed on the upper insulating layer. For example, when the upper surface connection pattern is disposed on one side of the upper insulating layer, the upper insulating layer may be formed through plating or the like. Also, when the upper surface connection pattern is embedded with at least a part thereof being exposed to the upper insulating layer, the upper insulating layer may be formed by forming a copper plating layer or the like and then partially removing the insulating layer or the electrically conductive layer through surface polishing or surface etching.

The upper surface connection pattern 272 may comprise a fine pattern like the above-described upper distribution pattern 251 disposed in at least a part. The upper surface connection pattern 272 comprising the fine pattern may enable plural elements to be electrically connected to one another even in a narrow area and facilitate electrical signal connection between elements or with the external, and this allows to achieve more integrated packaging.

The upper surface connective electrode 271 may be connected to the semiconductor element unit 30 directly through a terminal or via an element connection unit 51 such as a solder ball.

The cavity unit 28 comprises a cavity distribution layer 282 disposed on and/or under the second area 222 and electrically connected to the core distribution layer and an internal space 281 in which a cavity element 40 is disposed.

The cavity unit 28 may have the internal space 281 divided into plural districts by the cavity frame 286.

In detail, the second area 222 may have a thinner thickness of a glass substrate compared to the first area 221, and an internal area 281 formed due to the difference of the thickness may have a cavity element 40 disposed therein.

Additionally, a core via and a core distribution layer formed on the glass substrate 21 functions as an electrical connective structure for connecting a cavity element and an external element.

The cavity unit 28 is not limited in the shape and may be substantially a circle, a triangle, a quadrangle, a hexagon, an octagon, a cross, or the like, but in the present application a quadrangle is described as an example.

One side plane of the cavity unit 28 is referred to as a cavity first side plane 281*a*, another side plane different from the cavity first side plane is referred to as a cavity second side plane 281*b*, and in this time the supporting unit 285 may be disposed in at least one between the cavity first side plane 281*a* and the cavity second side plane 281*b*.

Also, a first side plane supporting unit 285*a* and a second side plane supporting unit 285*b* may be respectively disposed in a cavity first side plane 281*a* and a cavity second side plane 281*b* neighboring to each other.

The first side plane supporting unit 285*a* and the second side plane supporting unit 285*b* function as supporting the cavity element 40 to fix the position. When compared to applying only one supporting unit, applying two or more of the supporting units to be neighbor to each other can fix the position of a cavity element more firmly.

The supporting unit 285 may be a material having elasticity such as a spring, in detail, the supporting unit may be substantially same material as the glass substrate 21, and may be a glass spring supporting unit having an elastic force in the opposite direction from the force added to the supporting unit by the cavity element 40.

The cavity element 40 may have a shape which is substantially a cylinder, a rectangular parallelepiped, or a polygon.

An angle at a position where the cavity first side plane 281*a* and the cavity second side plane 281*b* meet from each other may be 45 to 135 degrees, 75 to 105 degrees, or substantially 90 degrees. By side plane supporting units prepared in the respective cavity first side plane 281*a* and cavity second side plane 281*b*, while an angle in the position where the cavity first side plane 281*a* and the cavity second side plane 281*b* itself meet has an arbitrary angle in the above range, it is possible to support the cavity element 40 stably.

A tangent line at a position where the first side plane supporting unit 285*a* having an arc shape meets a cavity element (a first tangent line) and a tangent line at a position where the second side plane supporting unit 285*b* having an arc shape meets a cavity element (a second tangent line) join from each other in a position (a point of contact of the first tangent line and the second tangent line), and an angle between the first tangent line and the second tangent line in the position may be 45 to 135 degrees, 75 to 105 degrees, or substantially 90 degrees. Such a case may be more advantageous for fixing the position of a cavity element, even though the outward appearance of a cavity element is not an edged shape as well as a case of a cavity element having an edged outward appearance.

A first side plane supporting unit length CS1 which is a length to the maximum protruding portion of the first side plane supporting unit 285*a* may be 15% or less, or 10% or less, when the cavity first side plane length C1 is designated as 100%. Also, the first side supporting unit length CS1 may be 1% or more, or 3% or more, when the cavity first side plane length C1 is designated as 100%.

A second side plane supporting unit length CS2 which is a length to the maximum protruding portion of the second side plane supporting unit 285*b* may be 15% or less, or 10% or less. Also, the second side plane supporting unit length CS2 may be 1% or more, or 3% or more, when the cavity second side length C2 is designated as 100%.

The supporting unit 285 may be directly connected to the glass substrate 21 thereby composing one body. In this case, because the supporting unit may be formed by etching of a glass substrate, manufacturing processes may be more simplified, and it may be more advantageous for controlling the properties of a packaging substrate since the physical properties of a supporting unit having elastic force are substantially similar to a glass substrate.

The supporting unit 285 functions as supporting a cavity element inserted by being derived in a side plane of the cavity unit, in detail, and may have an arc shape connecting one position to another position of a side plane of the cavity unit, or an arc shape connecting one end to another end of a side plane. When the supporting unit has an arc shape, the supporting unit lengths. CS1 and CS2, may be measured at a middle portion of the supporting unit.

A length from the most protruding position of the first side plane supporting unit 285*a* to the facing side plane of the cavity unit and a length from the most protruding position of the second side plane supporting unit 285*b* to the facing side plane of the cavity unit may be respectively the same as or smaller by 10% or less, or preferably by 0.1% to 8% than the corresponding position of a cavity element inserted to the cavity unit. Such a case is more advantageous for fixing a cavity element stably by the supporting unit.

The cavity unit 28 may comprise a cavity distribution pattern 283 which is electrically conductive layers for electrically connecting the cavity element 40 and the core distribution layer 24, and the cavity distribution pattern 283 may comprise a side wall pattern 283*a* which is electrically conductive layers disposed on the surface of a thickness direction of a glass substrate 21 in a boundary of the first are and the second area. However, the side wall patten is preferrable to be formed in a surface excepting for a side plane in which the supporting unit is formed.

The side wall pattern 283*a* may also function as a heat emitting layer for moving heat generated in a cavity unit 28 by a cavity element in addition to a role of transmitting electrical signals.

In detail, the cavity distribution layer 282 may comprise cavity elements 40 at least the some of which are disposed inside the internal space and a cavity insulating layer 284 which is an insulating layer for covering a cavity distribution pattern 283 and/or a side wall pattern 283*a* electrically connected to the core distribution layer.

The cavity distribution patten 283 may be formed in the packaging substrate, or may be provided in a form of a terminal such as an electrode 42 (connective electrode) of a cavity element 40.

The cavity element 40 may comprise a transistor. When an element like a transistor functioning as converting electrical signals between a mainboard 10 and a semiconductor element unit 30 to be a proper level is applied as the cavity element 40, it may be a form having a transistor or the like applied in a corner of the packaging substrate 20, and thereby can provide a semiconductor device 100 being more efficient with a rapid speed.

Passive elements such as capacitor may be individually inserted and applied to the cavity element 40, or an element group may be inserted inside of the cavity element after the element group comprising multiple passive elements is formed in a form of being embedded between insulating layers 46 (cavity element insulating layer) to expose an electrode. The latter case can facilitate workability of manufacturing a packaging substrate, and it is more advantageous for sufficiently and stably positioning an insulating layer in a space between complicated elements. In addition, a second core via 232 of a second area meeting the electrode of the cavity element 40 may have a core distribution pattern formed in the form of a filled via 283c. For example, a core via distribution pattern 241b formed on the first area core via 231 may have a form inside which a core insulating layer is filled, and a space may be formed in the internal thereof when observed at a side of an electrically conductive layer like a metal layer. The above case of a core via connected with a cavity element 40, unlike this, may have the form of a filled via 283c inside which an electrically conductive layer is filled. In this case, it is possible to facilitate electric power transmission of a cavity element in which a capacitor or the like is arranged thereby enhancing properties of a packaging substrate.

Specifically, the cavity element 40 may be electrically connected with a mainboard 10 by a connective electrode 42 formed on the lower surface thereof directly or through a lower layer. Also, the cavity element may be electrically connected with a semiconductor unit 30 by a connective electrode formed on the lower surface thereof directly or through a lower layer.

When the cavity unit 28 is disposed on or under the second area in this manner, at least one connective electrode among connective electrodes placed on both sides of the cavity element may be directly connected to the upper layer or the lower layer of the glass substrate, or directly connected to a semiconductor element 30 or a mainboard 10, and thereby it is possible to provide a semiconductor device with a simpler structure.

The mainboard 10 may have a terminal directly connected to a second surface distribution pattern 241c which is a core distribution pattern disposed on at least some of the second surface 214, or electrically connected through the medium of a board connection unit such as a solder ball. Also, the second surface distribution pattern 241c may be connected to the mainboard through the medium of a lower layer 29 disposed on a lower portion of the core layer 22.

The lower layer 29 comprises a lower distribution layer 291 and a lower surface connection layer 292.

The lower distribution layer 291 comprises i) a lower insulating layer 291b having at least a part in contact with the second surface 214; and ii) a lower distribution pattern 291a embodied in the lower insulating layer to have a predetermined pattern and electrically connected to the core distribution layer in at least a part thereof.

The lower distribution layer 291 may comprise i) a lower surface connective electrode 292a electrically connected to the lower surface connection pattern, and may further comprise ii) a lower surface connection pattern 292b having at least a part electrically connected to the lower distribution pattern and a part exposed on one side of the lower insulating layer.

The lower surface connection pattern 292b is a part connected to a motherboard 10 and may be formed as a non-fine pattern having a wider width than a fine pattern to be different from the upper surface connection pattern 272, for more efficient transmission of electrical signals.

Substantially additive different separate substrates are not applied to a packaging substrate disposed between the semiconductor element unit 30 and the mainboard 10 excepting for the glass substrate 21, as one characteristic of the present application.

Manufacturing Method for Packaging Substrate

The manufacturing method for a packaging substrate of the present application comprises, a preparation operation in which a defect is formed at predetermined positions of a first surface and a second surface of a glass substrate;

an etching operation in which an etchant is applied to the glass substrate where the defect is formed to provide a glass substrate with a core via formed thereon;

a core layer forming operation in which the surface of the glass substrate with the core via formed thereon is plated to form a core distribution layer, which is electrically conductive layers, thereby forming a core layer; and an upper layer forming operation in which an upper distribution layer, which is an electrically conductive layer covered by an insulting layer, is formed on one side of the core layer, thereby manufacturing a packaging substrate described above.

The core layer forming operation may comprise a pretreatment process in which an organic/inorganic composite primer layer comprising nanoparticles having amine groups is formed on the surface of the glass substrate having the core via formed thereon to prepare a pre-processed glass substrate; and a plating process in which a metal layer is plated on the pre-processed glass substrate.

An insulating layer forming operation may be further comprised between the core layer forming operation and the upper layer forming operation.

The insulating layer forming operation may be an operation of positioning an insulating film on the core layer and performing depressurizing lamination to form a core insulating layer.

The manufacturing method for a packaging substrate will be described in further detail.

1) Preparation Operation (Glass Defect Forming Process): A glass substrate having flat first and second surfaces is prepared, and a defect (hole) is formed at a predetermined position on the surface of the glass substrate to form a core via. As the glass substrate, a glass substrate applied to a substrate of an electronic device, or the like may be applicable. For example, a non-alkali glass substrate or a borosilicate glass substrate may be applicable, but the present application is not limited thereto. As commercially available products, products manufactured by manufacturer such as Corning Inc., Schott AG, and AGC Inc. may be applicable. In this time, a glass substrate in which a cavity unit is formed by removing a part of the glass substrate may be applicable, a glass substrate having a cavity unit formed by bonding flat glass substrates may be applicable, or a core via and a cavity unit may be simultaneously formed by forming a defect described below on the cavity unit of a flat glass substrate. Additionally, a cavity frame, a frame through hole, and a supporting unit may be simultaneously or separately formed with the manufacture of the cavity unit. In order to form the defect (hole), mechanical etching, laser irradiation, or the like may be applicable.

2-1) Etching Operation (Core Via Forming Operation): A glass substrate with the defect (hole) formed thereon forms a core via through a physical or chemical etching process. During the etching process, the glass substrate may form a via at the defective part and also the surface of the glass substrate may be etched at the same time. A masking film may be applicable to prevent the surface of the glass substrate from being etched, but the glass substrate itself with the defect may be etched in consideration of any inconvenience caused by a process of applying and removing the masking film. In this case, the glass substrate having the core via may be somewhat thinner than the initial glass substrate.

Chemical etching may be performed by positioning the glass substrate in which a hole is formed inside a bath comprising hydrofluoric acid and/or nitric acid and adding ultrasonic treatment or the like. In this time, the density of hydrofluoric acid may be 0.5 M or more, or 1.1 M or more. The density of hydrofluoric may be 3 M or less, or 2 M or less. The density of nitric acid may be 0.5 M or more, or 1 M or more. The density of nitric acid may be 2 M or less. The ultrasonic treatment may proceed at a frequency of 40 Hz to 120 Hz, or 60 Hz to 100 Hz.

2-2) Cavity Unit, Cavity Frame, and Frame Through Hole Forming Operation: A cavity unit, a cavity frame, and a frame through hole are formed by removing some of the glass substrate simultaneously or separately with the etching process. In detail, a defect for forming a cavity unit and a frame through hole is separately formed except a defect for forming a core via in the above. Thereafter, through an etching process simultaneously of separately with the etching for forming the core via, a second area having a thinner thickness than a first area, and a glass substrate having a cavity frame are manufactured. Furthermore, a supporting unit may be formed together at the same time as a core via and a cavity unit are formed in the etching process by a method of setting an irradiated laser not to remove a part of the internal of a cavity unit.

3-1) Core Layer Forming Operation: An electrically conductive layer is formed on the glass substrate. As a representative example of the electrically conductive layer, a metal layer containing copper metal may be applicable, but the present application is not limited thereto.

The surface of glass (comprising the surface of the glass substrate and the surface of the core via) and the surface of copper metal have different characteristics and thus are less adhesive. In example embodiments, the adhesion between the glass surface and the metal is improved by two methods, i.e., a dry method and a wet method.

The dry method is a method applying sputtering, that is, a method of forming a seed layer inside the core via and on the glass surface through metal sputtering. During the formation of the seed layer, another metal such as titanium, chromium, and nickel may be sputtered together with copper or the like. In this case, it is considered that glass-metal adhesion is improved by the anchor effect in which the surface morphology of the glass and the metal particles interact with each other.

The wet method is a method applying primer treatment, that is, a method of forming a primer layer by performing pre-treatment with a compound having a functional group such as amine. Depending on a desired degree of adhesion, after pre-treatment with a silane coupling agent, the primer treatment may be performed with a compound or particles having an amine functional group. As described above, it is necessary for the supporting substrate of the present application to have a high performance enough to form a fine pattern, and the high performance should be maintained even after the primer treatment. Accordingly, when such a primer contains nanoparticles, it is preferable that nanoparticles having an average diameter of 150 nm or less are applied. For example, it is preferable that nanoparticles are applied as particles having amine groups. The primer layer may be formed by applying, for example, a bonding-improving agent manufactured in CZ series by MEC Inc.

In the seed layer/primer layer, an electrically conductive layer, i.e., a metal layer may be selectively formed with or without removing a part where the formation of the electrically conductive layer is unnecessary. Also, in the seed layer/primer layer $21c$, a subsequent process may be performed after a part where the formation of the electrically conductive layer is necessary or a part where the formation of the electrically conductive layer is unnecessary is selectively processed such that the part becomes activated or deactivated for metal plating. For example, light irradiation treatment such as laser light of a certain wavelength, chemical treatment, or the like may be applied for the processing for activation or deactivation. A copper plating method or the like applied for manufacturing a semiconductor element may be applied to form the metal layer, but the present application is not limited thereto.

During the metal plating, the thickness of the electrically conductive layer may be regulated by adjusting several variables such as the concentration of a plating solution, a plating time, and the type of an additive applied.

When a part of the core distribution layer is unnecessary, the part may be removed. An etching layer of the core distribution layer may be formed by forming an electrically conductive layer in a predetermined pattern by performing metal plating after partially removing or deactivating the seed layer.

A separate electrically conductive layer may be adjusted to be formed or not to be formed on the supporting unit in a process of forming the core distribution layer.

In addition, at least some of core vias 232 (a second area core via) connected to the electrode of the cavity element may be manufactured in the form of a filled via 283$c$ for more efficient transmission of electric power, and the second area core via may be filled with a metal such as copper forming an electrically conductive layer in a plating layer forming operation together or through a separate operation of forming the filled via, thereby forming a filled via which enables more efficient transmission of signals.

Besides, the cavity element may be inserted before a subsequent insulating layer forming operation.

3-2) Insulating Layer Forming Operation: A core via and a frame through hole may pass an insulating layer forming operation in which an empty space of a core via is filled with an insulating layer after the core distribution layer, which is the electrically conductive layer, is formed. In this case, the insulating layer as a film type may be applied. For example, the film-type insulating layer may be applied through depressurizing lamination or the like. When the depressurizing lamination is performed, the insulating layer may be sufficiently embedded into the empty space inside the core via and the frame through hole to form a core insulating layer with reducing possibility of forming void defect.

4) Upper Layer Forming Operation: An upper distribution layer comprising an upper insulating layer and an upper distribution pattern is formed on the core layer. The upper insulating layer may be formed by coating a resin composition forming an insulating layer or stacking an insulating film. Simply, the stacking of the insulting film is preferable. The stacking of the insulating film may be performed by laminating and hardening the insulating film. In this case, when depressurizing lamination is applied, an insulating resin may be sufficiently embedded even into an empty part where the electrically conductive layer is not formed inside the core via. The upper insulating layer is at least partially in direct contact with the glass substrate, and thus provides sufficient adhesion. In detail, the glass substrate and the upper insulating layer may have an adhesion test value of 4 dB or more according to ASTM D3359.

The upper distribution pattern may be formed by repeating a process of forming the insulating layer, forming an electrically conductive layer in a predetermined pattern, and etching an unnecessary part to form an etching layer of the electrically conductive layer. An electrically conductive layer formed adjacent to each other with the insulating layer interposed therebetween may be formed by forming a blind via on the insulating layer and then performing a plating process. A dry etching method such as laser etching, plasma etching, and the like, a wet etching method using a masking layer and an etching solution, and the like may be applied to form the blind via.

5) Upper Surface Connection Layer and Cover Layer Forming Operation: An upper surface connection pattern and an upper surface connective electrode may be formed similarly to the formation of the upper distribution layer. In detail, the upper surface connection pattern and the upper surface connective electrode may be formed by forming an etching layer of an insulating layer on the insulating layer, forming an electrically conductive layer, and then forming an etching layer of the electrically conductive layer. However, a method of selectively forming only the electrically conductive layer may be applied without the etching. A cover layer may be formed to have an opening part at a position corresponding to the upper surface connective electrode such that the upper surface connective electrode is exposed and directly connected to an element connection unit, a terminal of an element, or the like.

6) Lower Surface Connection Layer and Cover Layer Forming Operation: A lower distribution layer and/or a lower surface connection layer, and optionally a cover layer may be formed similarly to the above-described formation of the upper surface connection layer and the cover layer.

Although the exemplary embodiments have been described in detail, the scope of the present invention is not limited thereto, and modifications and alterations made by those skilled in the art using the basic concept of the present invention defined in the following claims fall within the scope of the present invention.

DESCRIPTION OF FIGURE NUMBERS

100: Semiconductor device 10: Mainboard
30: Semiconductor element unit 32: First semiconductor element
34: Second semiconductor element 36: Third semiconductor element
20: Packaging substrate 22: Core layer
223: Core insulating layer 21, 21a: Glass substrate
213: First surface 214: Second surface
23: Core via 233: First opening part
234: Second opening part 235: Minimum inner diameter part
24: Core distribution layer 241: Core distribution pattern
241a: First surface distribution 241b: Core via distribution pattern pattern
241c: Second surface distribution 26: Upper layer pattern
25: Upper distribution layer 251: Upper distribution pattern
252: Blind via 253: Upper insulating layer
27: Upper surface connection layer 271: Upper surface connective electrode
272: Upper surface connection pattern
28: Cavity unit 281a: Cavity first side plane
281b: Cavity second side plane 282: Cavity distribution layer
283: Cavity distribution pattern 283a: Side wall pattern
282b: Core cavity connection pattern or Cavity element connective electrode
283c: Filled via 284: Cavity insulating layer
285: Supporting unit 286: Cavity frame
287: Frame through hole 29: Lower layer
291: Lower distribution layer 291a: Lower distribution pattern
291b: Lower insulating layer 292: Lower surface connection layer
292a: Lower surface connective 292b: Lower surface connection electrode pattern
40: Cavity element 42: Cavity element electrode
46: Cavity element insulating layer 50: Connection unit
51: Element connection unit 52: Board connection unit
60: Cover layer

What is claimed is:

1. A packaging substrate comprising:
   a glass substrate comprising a first surface and a second surface which is the opposite surface of the first surface;
   a cavity unit having a space formed inside the glass substrate;
   a cavity frame dividing the space into plural districts; and
   a cavity element comprised in at least some of the cavity unit,
   wherein the cavity frame comprises a frame through hole penetrating in a direction from the one surface to the other surface,
   wherein the frame through hole has a diameter of 30 μm to 500 μm, and
   the cavity frame has a width of 1.5 times or more and 5 times or less compared to the diameter of the frame through hole.

2. The packaging substrate of claim 1,
   wherein the diameter of the frame through hall is R, the length of the frame through hole is Lh, and a ratio R/Lh is 1 to 10.

3. The packaging substrate of claim 1,
   wherein the frame through hole is comprised in a plural number, and
   wherein an interval between the plural frame through holes is 1 time or more of the diameter of the frame through hole.

4. The packaging substrate of claim 1,
   wherein the frame through hole has at least some or the whole filled with a first material, and
   wherein the first material is any one selected from the group consisting of copper, epoxy, silica, and compositions thereof.

5. The packaging substrate of claim 1,
   wherein the glass substrate comprises a first area having a first thickness and a second area having a second thickness which is a thinner thickness than the first thickness,
   wherein the cavity unit is located on or under the second area.

6. The packaging substrate of claim 1,
   wherein a supporting unit is disposed in a side of the cavity frame.

7. The packaging substrate of claim 1,
   wherein the glass substrate comprises a core via penetrating in a direction from the first surface to the second surface except the cavity frame, and
   wherein a core distribution layer is comprised on the first and second surfaces connected to the core via.

8. A semiconductor device comprising:
a semiconductor element unit in which one or more semiconductor element is disposed;
the packaging substrate according to claim 1 electrically connected to the semiconductor element; and
a mainboard electrically connected to the packaging substrate and transmitting electrical signals to the semiconductor element.

\* \* \* \* \*